(12) United States Patent
Pang et al.

(10) Patent No.: US 8,436,648 B1
(45) Date of Patent: May 7, 2013

(54) VOLTAGE SEQUENCE OUTPUT CIRCUIT

(75) Inventors: Wei Pang, Shenzhen (CN); Cheng-Fei Weng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 6 days.

(21) Appl. No.: 13/340,644

(22) Filed: Dec. 29, 2011

(30) Foreign Application Priority Data

Dec. 16, 2011 (CN) .......................... 2011 1 0423209

(51) Int. Cl.
*H03K 19/177* (2006.01)
(52) U.S. Cl.
USPC ................................. 326/40; 326/46; 326/33
(58) Field of Classification Search .................. None
See application file for complete search history.

(56) References Cited

U.S. PATENT DOCUMENTS

| | | | |
|---|---|---|---|
| 7,876,128 B1* | 1/2011 | Hou ................................. | 326/57 |
| 2002/0087906 A1* | 7/2002 | Mar et al. ....................... | 713/330 |
| 2002/0104031 A1* | 8/2002 | Tomlinson et al. ........... | 713/320 |
| 2008/0048715 A1* | 2/2008 | Balasubramanian et al. .. | 326/37 |
| 2010/0188123 A1* | 7/2010 | Fox et al. ....................... | 327/143 |
| 2012/0139614 A1* | 6/2012 | Hou ............................... | 327/427 |

* cited by examiner

*Primary Examiner* — Jany Tran
(74) *Attorney, Agent, or Firm* — Altis Law Group, Inc.

(57) ABSTRACT

A sequential voltage output circuit is connected between a power supply and a number of loads. The voltage sequence output circuit includes a complex programmable logic device (CPLD) and a number of switching circuits. When the CPLD receives a power on signal, the CPLD outputs a number of control signals sequentially through a number of outputs. When a switching circuit receives a control signal from the CPLD, the switching circuit allows the power supply to supply power to a corresponding load.

8 Claims, 2 Drawing Sheets

VOLTAGE SEQUENCE OUTPUT CIRCUIT

BACKGROUND

1. Technical Field

The present disclosure relates to voltage output circuits and, particularly, to a voltage sequence output circuit capable of sequentially triggering electronic devices.

2. Description of Related Art

As a number of loads that are coupled to one circuit are powered simultaneously, the circuit may be prone to damage by current surge or voltage spikes when initially powered on.

BRIEF DESCRIPTION OF THE DRAWINGS

Many aspects of the embodiments can be better understood with reference to the drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
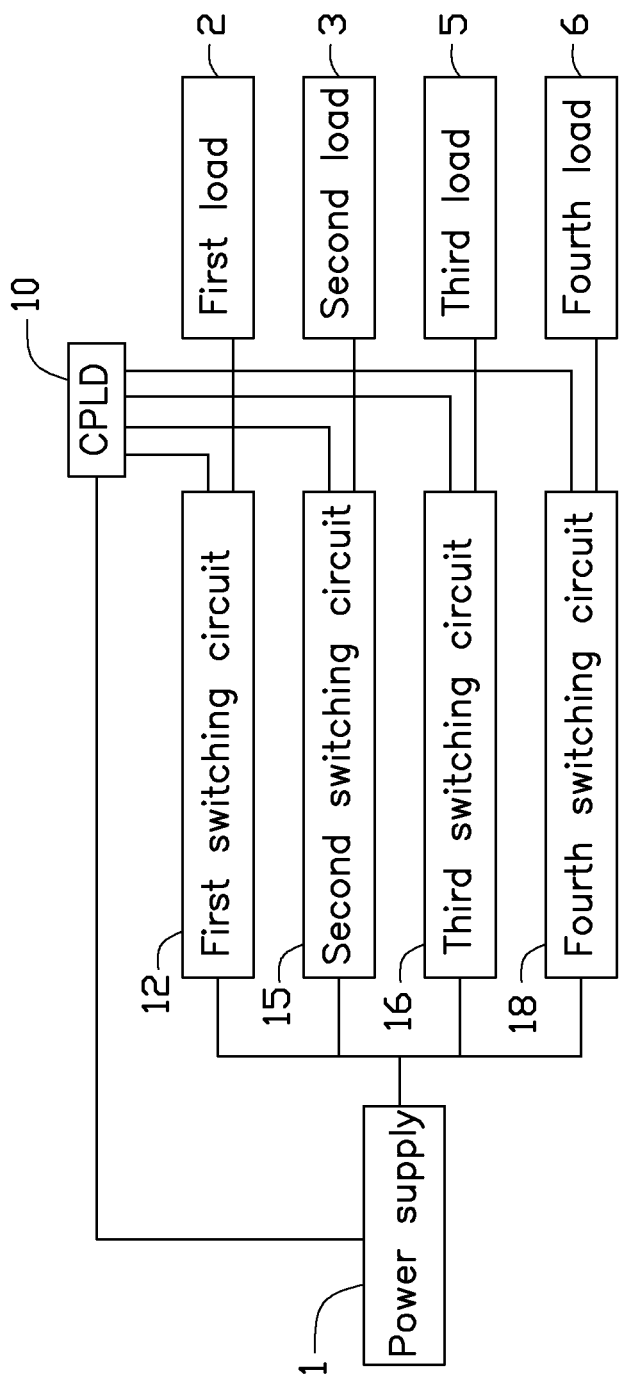
FIG. 1 is a block diagram of an exemplary embodiment of a voltage sequence output circuit connected to a plurality of loads.

Referring to FIG. 1, an exemplary embodiment of a voltage sequence output circuit is connected between a power supply 1 and a plurality of loads. In the embodiment, the loads include a first load 2, a second load 3, a third load 5, and a fourth load 6. The power supply 1 supplies power to all the loads.

The voltage sequence output circuit includes a complex programmable logic device (CPLD) 10 and first to fourth switching circuits 12, 15, 16, and 18.

The CPLD 10 is connected to the power supply 1 for receiving a power-on signal PWRGD_PS. When the CPLD 10 receives the power-on signal PWRGD_PS, the CPLD 10 sequentially outputs first to fourth control signals PWRGD_DLY1, PWRGD_DLY2, PWRGD_DLY3, and PWRGD_DLY4 to the first to fourth switching circuits 12, 15, 16, and 18.

The first switching circuit 12 is connected between the power supply 1 and the first load 2. The second switching circuit 15 is connected between the power supply 1 and the second load 3. The third switching circuit 16 is connected between the power supply 1 and the third load 5. The fourth switching circuit 18 is connected between the power supply 1 and the fourth load 6. All of the switching circuits 12, 15, 16, and 18 function in substantially the same manner in relation to their respective loads. Thus when the first switching circuit 12 receives the first control signal PWRGD_DLY1 from the CPLD 10, the first switching circuit 12 transmits power from the power supply 1 to the first load 2, and when the second switching circuit 15 receives the second control signal PWRGD_DLY2 from the CPLD 10, the second switching circuit 15 transmits power from the power supply 1 to the second load 3.

Figure 2:
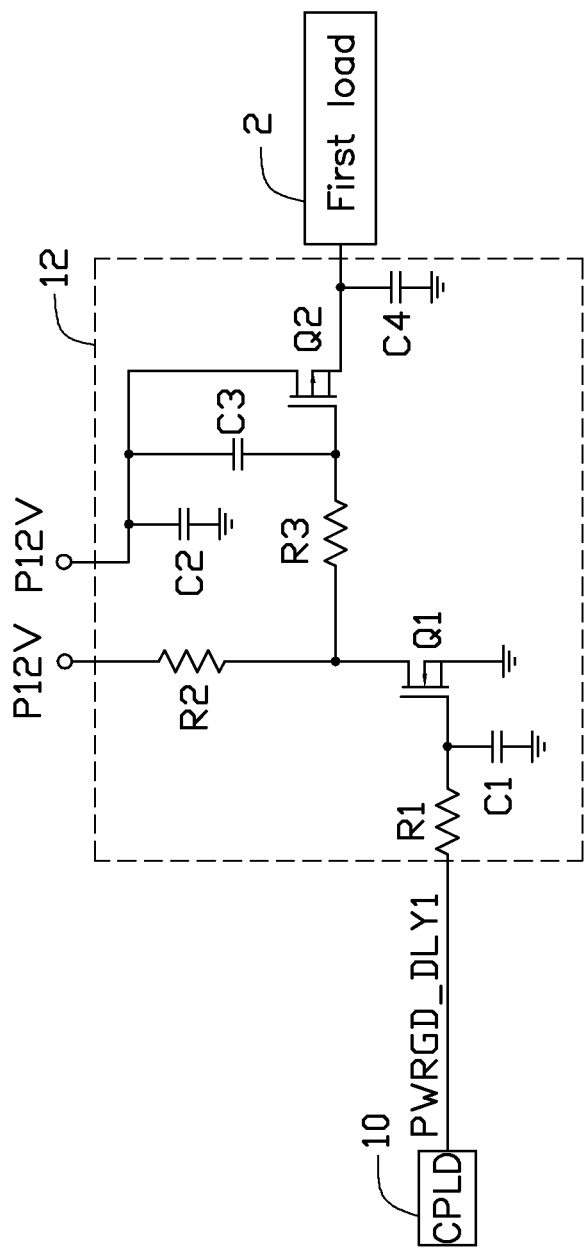
FIG. 2 is a circuit diagram of the voltage sequence output circuit of FIG. 1.

Referring to FIG. 2, the power supply 1 is 12 volts, and is denoted as P12V. The first switching circuit 12 includes two field effect transistors (FETs) Q1 and Q2, three resistors R1, R2, and R3, and four capacitors C1, C2, C3, and C4. A gate of the FET Q1 is connected to a first output of the CPLD 10 through the resistor R1 for receiving the first control signal PWRGD_DLY1 from the CPLD 10. The gate of the FET Q1 is further grounded through the capacitor C1. A source of the FET Q1 is grounded. A drain of the FET Q1 is connected to the power supply 1 through the resistor R2.

The drain of the FET Q1 is further connected to a gate of the FET Q2 through the resistor R3. A source of the FET Q2 is connected to the power supply 1. The source of the FET Q2 is further grounded through the capacitor C2 and is connected to a gate of the FET Q2 through the capacitor C3. A drain of the FET Q2 is connected to the first load 2. The drain of the FET Q2 is further grounded through the capacitor C4. The FET Q1 is an n-channel FET, and the FET Q2 is a p-channel FET.

The switching circuits 15, 16, and 18 have the same structure as the first switching circuit 12, thus a gate of a first FET in the second switching circuit 15 is connected to a second output of the CPLD 10 through a resistor to receive the second control signal PWRGD_DLY2 and a drain of a second FET in the second switching circuit 15 is connected to the second load 3.

When the power supply 1 is turned on, the power supply 1 outputs the power-on signal PWRGD_PS to the CPLD 10. The first to fourth outputs of the CPLD 10 sequentially output the first to fourth control signals PWRGD_DLY1, PWRGD_DLY2, PWRGD_DLY3, and PWRGD_DLY4 to the first to fourth switching circuits 12, 15, 16, and 18, at intervals of 200 milliseconds (ms). In other words, when the CPLD 10 receives the power-on signal PWRGD_PS, the first output of the CPLD 10 outputs the first control signal PWRGD_DLY1. After a delay of 200 ms, the second output of the CPLD 10 outputs the second control signal PWRGD_DLY2. After a delay of 400 ms, the third output of the CPLD 10 outputs the third control signal PWRGD_DLY3. After a delay of 600 ms, the fourth output of the CPLD 10 outputs the fourth control signal PWRGD_DLY4. In the embodiment, the first to fourth control signals PWRGD_DLY1, PWRGD_DLY2, PWRGD_DLY3, and PWRGD_DLY4 are high level signals.

When the first switching circuit 12 receives the first control signal PWRGD_DLY1, the FET Q1 is turned on, and the FET Q2 is turned on. As a result, the power supply 1 supplies power to the first load 2. At this moment, the second to fourth outputs of the CPLD 10 are not outputting the control signals. The FETs in the second switching circuit 15, the third switching circuit 16, and the fourth switching circuit 18 are turned off. The power supply 1 is not supplying power to the second load 3, the third load 5, and the fourth load 6.

After the delay of 200 ms, the second output of the CPLD 10 outputs the second control signal PWRGD_DLY2 to the second switching circuit 15. Like the first switching circuit 12, when the second switching circuit 15 receives the second control signal PWRGD_DLY2, the power supply 1 does supply power to the second load 3. At this moment, the third and fourth outputs of the CPLD 10 are not outputting the control signals. The FETs in the third switching circuit 16 and the fourth switching circuit 18 are turned off. The power supply 1 is not supplying power to the third load 5 and to the fourth load 6.

After the delay of 400 ms, the third output of the CPLD 10 outputs the third control signal PWRGD_DLY3 to the third switching circuit 16. Like the first switching circuit 12, when the third switching circuit 16 receives the third control signal PWRGD_DLY3, the power supply 1 does supply power to the third load 5. At this moment, the fourth output of the CPLD 10 is not outputting the fourth control signal. The FETs in the fourth switching circuit 18 are turned off. The power supply 1 does not supply power to the fourth load 6.

After the delay of 600 ms, the fourth output of the CPLD 10 outputs the fourth control signal PWRGD_DLY4 to the fourth switching circuit 18. Like the first switching circuit 12, when the fourth switching circuit 18 receives the fourth control signal PWRGD_DLY4, the power supply 1 does supply power to the fourth load 6.

As a result, the first to fourth loads 2, 3, 5, and 6 are not supplied simultaneously, so reducing the magnitude of any current surge or voltage spike. Furthermore, in the embodiment, the FETs Q1 and Q2 function as simple electronic switches. Therefore, the FETs Q1 and Q2 can be replaced by any other electronic switches, such as transistors.

The foregoing description of the exemplary embodiments of the disclosure has been presented only for the purposes of illustration and description and is not intended to be exhaustive or to limit the disclosure to the precise forms disclosed. Many modifications and variations are possible. The embodiments were chosen and described in order to explain the principles of the disclosure and their practical application so as to enable others of ordinary skill in the art to utilize the disclosure and various embodiments and with such modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than by the foregoing description and the exemplary embodiments described therein.

What is claimed is:

1. A voltage sequence output circuit connected between a power supply and a plurality of loads, the voltage sequence output circuit comprising:
   a complex programmable logic device (CPLD) comprising an input and a plurality of outputs, wherein the input is connected to the power supply for receiving a power on signal, when the CPLD receives the power-on signal, the CPLD sequentially outputs a plurality of control signals through the outputs; and
   a plurality of switching circuits, wherein each switching circuit comprises a first electronic switch and a second electronic switch, a control terminal of the first electronic switch is connected to a corresponding output of the CPLD, a first terminal of the first electronic switch is connected to the power supply through a first resistor, a second terminal of the first electronic switch is grounded, the first terminal of the first electronic switch is further connected to a control terminal of the second electronic switch, a first terminal of the second electronic switch is connected to the power supply, a second terminal of the second electronic switch is connected to a corresponding load, when the first electronic switch receives the corresponding control signal from the CPLD, the first terminal of the first electronic switch is connected to the second terminal of the first electronic switch, and the first terminal of the second electronic switch is connected to the second terminal of the second electronic switch, such that the power supply supplies power to the load.

2. The circuit of claim 1, wherein the first electronic switch is an n-channel field effect transistor (FET), a gate of the FET is the control terminal of the first electronic switch, a drain of the FET is the first terminal of the first electronic switch, a source of the FET is the second terminal of the first electronic switch.

3. The circuit of claim 1, wherein the second electronic switch is a p-channel FET, a gate of the FET is the control terminal of the second electronic switch, a drain of the FET is the first terminal of the second electronic switch, a source of the FET is the second terminal of the second electronic switch.

4. The circuit of claim 1, wherein the first terminal of the first electronic switch is connected to the control terminal of the second electronic switch through a second resistor.

5. The circuit of claim 1, wherein the control terminal of the first electronic switch is grounded through a capacitor.

6. The circuit of claim 1, wherein the second terminal of the second electronic switch is grounded through a capacitor.

7. The circuit of claim 1, wherein the first terminal of the second electronic switch is grounded through a capacitor.

8. The circuit of claim 1, wherein the first terminal of the second electronic switch is connected to the control terminal of the second electronic switch through a capacitor.

* * * * *